US005859534A

United States Patent [19]

Saijo et al.

[11] Patent Number: 5,859,534

[45] **Date of Patent: *Jan. 12, 1999**

[54] CONNECTOR EXAMINATION AND CORRECTION DEVICES AND METHODS EXAMINING AND CORRECTING SAME

[75] Inventors: Eiji Saijo; Masahiko Aoyama; Keigo Atsumi, all of Yokkaichi, Japan

[73] Assignee: Sumitomo Wiring Systems, Yokkaichi, Japan

[ * ] Notice: The term of this patent shall not extend beyond the expiration date of Pat. No. 5,455,515.

[21] Appl. No.: 341,890

[22] Filed: Nov. 15, 1994

[30] Foreign Application Priority Data

| | | | |
|---|---|---|---|
| Nov. 18, 1993 | [JP] | Japan | 5-314549 |
| Dec. 7, 1993 | [JP] | Japan | 5-340492 |

[51] Int. Cl.$^{6}$ .......... G01R 31/02

[52] U.S. Cl. .......... 324/538; 324/761; 439/595; 439/488

[58] Field of Search .......... 324/538, 761, 324/556; 439/488, 489, 595, 490

[56] References Cited

U.S. PATENT DOCUMENTS

| | | | |
|---|---|---|---|
| 3,768,089 | 10/1973 | Costazo | 324/538 |
| 4,634,204 | 1/1987 | Detter | 439/488 |
| 4,777,445 | 10/1988 | Kahl | 324/538 |
| 4,902,968 | 2/1990 | Sugimoto . | |
| 5,108,305 | 4/1992 | Suzuki | 324/538 |
| 5,127,847 | 7/1992 | Kato et al. | 439/489 |
| 5,179,343 | 1/1993 | Chishima et al. | 439/489 |
| 5,425,653 | 6/1995 | Koiso | 439/589 |
| 5,455,515 | 10/1995 | Saijo et al. | 324/538 |
| 5,462,449 | 10/1995 | Tsuji et al. | 439/489 |
| 5,462,450 | 10/1995 | Kodama | 439/489 |
| 5,470,251 | 11/1995 | Sano | 439/489 |
| 5,481,204 | 1/1996 | Aikawa | 324/538 |

FOREIGN PATENT DOCUMENTS

| | | | |
|---|---|---|---|
| 0 565 080 | 4/1993 | European Pat. Off. . | |
| 0565080 | 10/1993 | European Pat. Off. | 324/538 |
| 62-047093 | 12/1987 | Japan . | |
| 2 169 153 | 12/1984 | United Kingdom . | |

*Primary Examiner*—Josie Ballato
*Assistant Examiner*—Thomas Valone
*Attorney, Agent, or Firm*—Oliff & Berridge, PLC

[57] ABSTRACT

To judge with certainty whether the condition of attachment of each metal terminal is proper, a method and apparatus are provided in which a thinned distal end portion of a lance check pin having guide portions contacts an inner surface of a lance flexing space. The lance check pin, when inserted into the lance flexing space, is kept in a proper posture by the guide portions. Therefore, misjudgment of the terminal position is avoided.

29 Claims, 9 Drawing Sheets

CONNECTOR EXAMINATION AND CORRECTION DEVICES AND METHODS EXAMINING AND CORRECTING SAME

BACKGROUND OF THE INVENTION

This invention relates to a connector examination device and method for detecting improper attachment of a metal terminal inserted in a connector housing. The invention also relates to a metal terminal-correcting jig and a method for mounting a metal terminal, disposed in an improperly-inserted position, in a properly-inserted position, and to a connector correction device provided with the jig.

Generally, a connector comprises a connector housing of a plastics material in which metal terminals, each fixedly secured to one end of a wire, are mounted, and each metal terminal is retained against withdrawal by a lance (elastic retaining pawl) formed integrally within the connector housing. When the metal terminal is inserted into the connector housing, the lance is flexed downwardly toward a flexing space until the metal terminal is inserted into a proper position, at which point the lance is elastically restored to engage a void formed along a bottom surface of the metal terminal, thereby preventing withdrawal of the metal terminal.

With this type of terminal withdrawal prevention construction, a certain degree of a frictional force acts between the metal terminal and the lance when the metal terminal is inserted. The frictional force is of such a degree that the metal terminal cannot be inserted into the housing any further, which may give the impression to an operator that the terminal is reliably secured by the lance, even though it is not properly inserted into the housing. Accordingly, the operator, engaged in the inserting operation, may misunderstand that complete insertion has been achieved, and may stop the inserting operation before the lance actually engages the terminal.

However, if the metal terminal is not completely inserted into the proper position where the metal terminal engages the lance in the connector housing, the metal terminal can become withdrawn from the housing during use. Therefore it is necessary to preliminarily inspect the terminal connections to correct any improperly inserted or incompletely connected terminals.

Recently, various kinds of connector examination devices have been developed for detecting improper attachment of a metal terminal. The present applicant filed an application (Japanese Patent Application No. 5-281716) shown in FIG. 7. In this construction, a lance check pin 51 is provided in a projected manner in opposed relation to each lance 34 in a connector 60, and the lance check pin 51 is adapted to be inserted into a lance flexing space 63 formed in a connector housing 62. When a metal terminal 33 is completely inserted into a proper position, the lance check pin 51, inserted in the lance flexing space 63, does not strike against the lance 34, but is brought into underlying relation with the lance, as shown at an upper stage in FIG. 7. When the metal terminal 33 is in an improperly-attached condition, the lance check pin 51 strikes against the distal end of the lance 34 that is elastically deformed in the lance flexing space 63, as shown at a lower stage in FIG. 7. In this construction, when the metal terminal 33 is in an improperly-attached condition, with the lance 34 disposed in the lance flexing space 63, the lance check pin 51 strikes against the distal end of the lance 34. Accordingly, the check pin 51 cannot be positioned beneath the lance 34. As a result, improper attachment of the metal terminal 33 occurs.

For molding reasons, even when the metal terminal 33 is completely inserted into the proper position, with the lance 34 substantially retracted from the lance flexing space 63 and into the terminal 33, the lance 34 still projects slightly inwardly towards an inner wall surface of the lance flexing space 63. In this connection, a distal end portion 51*a* of the lance check pin 51 is made smaller in thickness than the lance flexing space 63 so that the lance check pin can be brought into underlying relation to the lance 34. Therefore, a gap is formed between the distal end portion 51*a* of the lance check pin 51 and the bottom portion of the terminal 33.

Therefore, it is possible that when the lance check pin 51 is inserted into the lance flexing space 63, the distal end portion 51*a* of the lance check pin 51 is inserted into the lance flexing space 63 in a bent, deformed manner, or the lance check pin 51 is inserted obliquely. In such a situation, even when the metal terminal 33 is completely inserted into the proper position, with the lance 34 fully retracted from the lance flexing space 63, the distal end portion 51*a* of the lance check pin 51 can strike against the slightly-projected portion of the lance 34. As a result, despite the fact that the metal terminal 33 is disposed in the proper position, the lance check pin 51 can not reach the position beneath the lance 34, and therefore it may be erroneously judged that the metal terminal 33 is in an improperly-attached condition.

In addition, there have been several proposed devices to confirm and inspect the position of the terminal. For example, a retainer that engages the metal terminal (with which the lance is also engaged) is inserted into the housing when an operator believes that the terminal is in the properly-inserted position, thus providing, together with the lance, a second engagement if the terminal is inserted to a depth where the lance engages a void or hole in the terminal. The retainer is provisionally attached to the connector before the metal terminals are inserted, and in this condition, after the metal terminals are inserted, the retainer is moved into a completely-attached position to engage the metal terminals.

At this time, if the metal terminal is disposed in an improperly-inserted position (short of the properly-inserted position), the retainer engages the metal terminal, and can not be moved into the completely-attached position. Thus, the retainer indicates whether the metal terminals have bee inserted into the properly-inserted position. If it is judged that any metal terminal has not been inserted into the properly-inserted position, i.e., the retainer engages the metal terminal rather than a recess or the void of the metal terminal, the metal terminal is removed and tried again.

In the above method in which the retainer is used to determine proper positioning of the terminals, the retainer, mounted on the connector in the completely-attached position, remains connected to the connector, and even after the inspecting of the terminal is complete, the retainers remain mounted on the connector housings. Therefore, inspection of the terminals requires a permanently mounted retainer for each terminal and therefore the cost and number of the parts required for inspecting terminals is high.

Moreover, the retainer merely judges whether the metal terminal is disposed in the properly-inserted position or an improperly-inserted position, and when it is judged that the metal terminal is in the improperly-inserted position, an operator is required to remove the terminal and attempt to reinsert the terminal. After the retainer is attached again, the condition of insertion of the metal terminals is rechecked, thus requiring even more time and labor. Therefore, the overall efficiency of the metal terminal-inserting operation suffers.

SUMMARY OF THE INVENTION

The present invention has been made under the above circumstances, and an object of the invention is to provide a device and method for correcting the condition of insertion of metal terminals, in which the metal terminal-inserting operation can be carried out quite efficiently.

Another object of the invention is to provide a connector examination device and method capable of judging with certainty whether a metal terminal is attached in a proper or an improper condition, and can effect a highly reliable inspection.

To achieve the above objects, in a first aspect of the present invention, there is provided a connector examination device having lance check pins that can be inserted into lance flexing spaces for allowing elastic deformation of the lance during the insertion of a metal terminal. The lance check pin is inserted into the lance flexing space and abutted against the lance when the metal terminal assumes an improperly-attached condition. The lance check pin includes a guide portion for contacting an inner surface of the lance flexing space so as to keep the lance check pin in the proper position in the lance flexing space. A judgment device judges from the position of the lance check pin whether the lance check pin is abutted against the lance.

According to a second aspect of the invention, there is provided an inspection housing having a setting portion for receiving a connector to be examined; sliders mounted on the inspection housing for movement toward and away from the connector; a lance check pin provided on each of the sliders, and can be inserted into a lance flexing space to be abutted against a lance when the metal terminal assumes an improperly-attached condition; and a judgment device mounted on each of the sliders for judging from the position of the lance check pin whether the lance check pin is abutted against the lance. The lance check pin includes a guide portion for contacting an inner surface of the lance flexing space to keep the lance check pin in the proper position in the lance flexing space.

According to a third aspect of the present invention, there is provided a connector holder for holding a connector to be examined; an inspection housing provided in opposed relation to the connector holder; a drive mechanism for reciprocally moving one or both of the connector holder and said inspection housing toward each other; sliders mounted on said inspection housing for movement toward and away from the connector; a lance check pin provided on each of the sliders, the lance check pins being insertable into the lance flexing space and, upon insertion, abutting against a lance when the metal terminal assumes an improperly-attached condition; and a judgment device mounted on each of the sliders for judging from the position of the lance check pin whether the lance check pin is abutted against the lance. The lance check pin includes a guide portion for contacting an inner surface of the lance flexing space to keep the lance check pin in a proper position in the lance flexing space.

The judgment device may comprise an electrical contact member mounted for movement with the lance check pin to engage the metal terminal received and retained in the proper position in the connector housing against withdrawal. The electrical contact member may be connected to a conduction examination circuit for a wire harness. The lance check pin may have a relief recess for preventing the guide portion from interfering with stabilizers extending from the metal terminal and straddling opposite sides of said lance.

According to still another aspect of the present invention, there is provided a device for inspecting a terminal inserted within a connector housing. The connecting has a lance capable of securing the terminal in a locking position and a lance flexing space into which the lance flexibly extends as the terminal is inserted within the connector housing. The device includes a lance check pin that is inserted into the lance flexing space, and means for guiding a tip portion of the lance check pin in a first position below a bottom portion of the lance when the lance is disposed in the locking position, even when the lance partially protrudes within the lance flexing space and the tip portion is at least one of irregularly formed and obliquely inserted.

According to another aspect of the present invention there is provided a method of inspecting a terminal inserted within a connector housing having a lance capable of securing the terminal in a locking position, and a lance flexing space into which the lance flexibly extends as the terminal is inserted within the connector housing. The method includes the steps of inserting a lance check pin within the lance flexing space, and guiding a tip portion of the check pin in a first position below a bottom portion of the lance when the lance is disposed in the locking position, even when the lance partially protrudes within the lance flexing space and the tip portion is at least one of irregularly formed and obliquely inserted.

With an examination device and method having these features, the lance engages the metal terminal, and is retracted from the lance flexing space when the metal terminal is inserted into the proper position in the connector housing. When the metal terminal is disposed in an incompletely-inserted position (short of the proper position), the lance does not engage the metal terminal, and is elastically deformed into the lance flexing space.

When the metal terminal is inserted into the proper position, with the lance retracted from the lance flexing space, the lance check pin, inserted into the lance flexing space, will not abut against the lance, and is therefore positioned below the lance. The judgment device judges from the position of the lance check pin that the lance check pin is not abutted against the lance. Accordingly, a properly inserted metal terminal that is completely inserted into the housing can be detected.

In contrast, when the metal terminal in the connector is disposed in an incompletely-inserted position, with the lance flexed into the lance flexing space, the lance check pin abuts against the lance, and therefore is prevented from further insertion. The judgment device judges from the position of the thus shallowly-inserted lance check pin that the lance check pin is abutted against the lance, and in accordance with this, the fact that the metal terminal is in an improperly-inserted condition is detected.

In the connector examination device, the connector to be examined is received in the setting portion of the inspection housing, and each slider is moved to attempt insertion of the lance check pin into the lance flexing space in the connector to examine the position of the check pin.

When the metal terminal in the connector is inserted into the proper position, with the lance retracted from the lance flexing space, the lance check pin will not abut against the lance, and therefore is inserted below the lance. The judgment device judges from the position of the lance check pin that the lance check pin is not abutted against the lance, and in accordance with this, the fact that the metal terminal is completely inserted into the proper position is detected.

In contrast, when the metal terminal in the connector is disposed in an incompletely-inserted position, with the lance flexed into the lance flexing space, the lance check pin abuts against the lance, and therefore is prevented from further insertion so that the slider is prevented from moving toward the connector. The judgment device judges from the position of the shallowly-inserted lance check pin that the lance check pin is abutted against the lance, and in accordance with this, the fact that the metal terminal is in an improperly-inserted condition is detected.

In the connector examination device, the connector to be examined is set in the connector holder, and the drive mechanism moves the inspection housing and the connector holder toward each other, so that each lance check pin is inserted into the associated lance flexing space in the connector housing, thereby effecting terminal position examination.

When the metal terminal in the connector is inserted into the proper position, with the lance retracted from the lance flexing space, the lance check pin will not abut against the lance, and therefore is inserted deep. The judgment device judges from the position of the thus deeply-inserted lance check pin that the lance check pin is not abutted against the lance, and in accordance with this, the fact that the metal terminal is completely inserted into the proper position is detected.

In contrast, when the metal terminal in the connector is disposed in an incompletely-inserted position, with the lance flexed into the lance flexing space, the lance check pin abuts against the lance, and therefore is prevented from further insertion. The lance check pin and the slider are moved backward relative to the inspection housing. The judgment device judges from the position of the thus shallowly-inserted lance check pin that the lance check pin is abutted against the lance, and in accordance with this, the fact that the metal terminal is in an improperly-inserted condition is detected.

The guide portion of the lance check pin inserted into the lance flexing space is brought into contact with the inner surface of the lance flexing space, and by doing so, the lance check pin can be inserted into the lance flexing space while being kept in the proper posture. Namely, even if the lance check pin is bent or deformed, or if the lance check pin is inserted obliquely into the lance flexing space, such deformation and oblique insertion are corrected in the lance flexing space by guiding portions formed on the check pins, so that the lance check pin can be inserted into the lance flexing space while kept in the proper posture.

When the lance check pin is inserted without abutting the lance, the electrical contact member provided on the judgment device contacts the metal terminal to make an electrical connection, so that detection of the completely inserted position of the metal terminal can be detected. In contrast, when the lance check pin abuts against the lance, the electrical contact member does not contact the metal terminal, so that the electrical connection is not achieved. As a result, the improperly-inserted condition of the metal terminal is detected.

Furthermore, because each electrical contact member is connected to the conduction examination circuit for a wire harness, examination for the wire harness and the examination for the position of attachment of the metal terminal can be carried out at the same time. In addition, the metal terminal has stabilizers extending at the opposite sides of the lance, and even when the stabilizers project into the lance flexing space, the stabilizers will not interfere with the guide portion of the lance check pin.

According to a another aspect of the present invention, there is provided a method for connecting at least one terminal disposed within a connector housing. The method includes the steps of inserting a pressing portion of at least one jig into a terminal receiving chamber of the connector housing where the terminal is disposed; and sliding the pressing portion in the terminal receiving chamber in a fixed position wherein a recess formed in the jig and adjacent the pressing portion mates with a guide portion formed on the connector housing. The pressing portion slides the terminals into a locking position and confirms that the terminal is in the locking position when the pressing portion is in the fitted position. After correcting the position of the terminal within the connector housing, the jig is removed from the connector housing.

In another aspect of the present invention, there is provided a jig for correcting metal terminals disposed in a connector including pressing portions abuttable against ends of the respective metal terminals, when the metal terminals are disposed in an improperly-inserted position, to move the terminals into a properly-inserted position. Each pressing portion may be inserted into the connector through an insertion hole for the associated metal terminal, and abuts against a rear end of the metal terminal to urge the metal terminal toward the properly-inserted position. The pressing portions may be arranged in such a manner as to be disposed on opposite sides of wires fixedly connected to the respective metal terminals and extending from the connector, and can push the respective metal terminals. The jig has a relief portion for preventing the jig from interfering with the wires when the jig is moved to a position where the pressing portions are disposed on the opposite sides of the wires.

According to yet another aspect of the present invention, there is provided a connector examination device comprising a connector holder portion for holding a connector having metal terminals inserted therein; a metal terminal-correcting jig having pressing portions abuttable, by relative movement between the holder and the jig, against the respective metal terminals, when the metal terminals are disposed in an improperly-inserted position, to move the metal terminals into a properly-inserted position; and a moving mechanism for effecting the relative movement between the connector holder portion and the metal terminal-correcting jig.

According to still another aspect of the present invention, there is provided connector examination device comprising a connector holder portion for holding a connector having metal terminals inserted therein to constitute a wire harness; a metal terminal-correcting jig having pressing portions abuttable, by relative movement between the connector and the jig, against the respective metal terminals, when the metal terminals are disposed in an improperly-inserted position, to move the metal terminals into a properly-inserted position; a moving mechanism for effecting the relative movement between the connector holder portion and the metal terminal-correcting jig; and a detection device for judging a connected condition of the wire harness.

The metal terminal-correcting jig is attached to the connector after the metal terminals are inserted into the connector. If any of the metal terminals is disposed in an improperly-inserted position short of the properly-inserted position, the pressing portion of the metal terminal-correcting jig is abutted against the metal terminal to move it to the properly-inserted position. As a result, the metal terminal, disposed in the improperly-inserted position, is retained against withdrawal by the lance. The metal terminal-correcting jig, after thus attached to the connector, is removed from the connector.

Each pressing portion is inserted into the connector through the insertion hole for the metal terminal, and is abutted against the rear end of the metal terminal to move it to the properly-inserted position.

The pressing portions are arranged in such a manner as to be disposed on the opposite sides of the wires, and push the respective metal terminals, thereby moving those metal terminals, disposed in an improperly-inserted position, to the properly-inserted position. When the jig is to be moved to the position where the pressing portions are disposed on the opposite sides of the wires, the relief portion is brought into registry with the wires, thereby preventing the interference of the jig with the wires.

The connector is held by the connector holder portion, and the relative movement between the connector holder portion and the metal terminal-correcting jig is effected by the moving mechanism, so that the pressing portion is abutted against the metal terminal, disposed in an improperly-inserted position, to move it to the properly-inserted position.

The connector constituting the wire harness is held by the connector holder portion, and the relative movement between the connector holder portion and the metal terminal-correcting jig is effected by the moving mechanism, so that the pressing portion 5 are abutted against the metal terminal, disposed in an improperly-inserted position, to move it to the properly-inserted position, and the conducting condition of the wire harness is judged by the conduction detection device.

As described above, in the connector examination devices of the present invention, even if the lance check pin is bent or deformed, or if the lance check pin is obliquely inserted into the lance flexing space, the lance check pin can be inserted into the lance flexing space while kept in the proper posture. This positively eliminates the abutment of the lance check pin against the lance, retracted from the lance flexing space, which results from the deformation or oblique insertion of the lance check pin. As a result, to misjudge that the metal terminal is disposed in an incompletely-inserted position although the metal terminal is actually disposed in the proper position, is prevented, and highly reliable examination can be carried out.

As described above, in the terminal examination and correcting device and method of the present invention, the metal terminal-correcting jig is attached to the connector, and after correction, is removed therefrom. Therefore the same jig can be repeatedly used for a number of connectors, and it is not necessary to prepare as many jigs as the connectors as is the case with retainers of the prior art. Therefore, the number of the parts is reduced, and the costs can be reduced.

If there exists any metal terminal disposed in an improperly-inserted position, the jig, when attached to the connector, can move the metal terminal to the properly-inserted position. Therefore, in contrast with the conventional construction in which it is only possible to check by a retainer whether the metal terminals are disposed in an improperly-inserted position, it is not necessary to remove and then reinsert the metal terminals and to recheck the condition of insertion of the metal terminals. Accordingly, the overall inserting operation for the metal terminals 10 can be enhanced.

The metal terminal-correcting jig optionally has the relief portion for preventing it from interfering with the wires, and therefore the plurality of pressing portions to be disposed at the opposite sides of the wires can be provided on a unitary structure.

Relative movement between the connector holder portion and the metal terminal-correcting jig can be effected by the moving mechanism, and the operation for moving the metal terminals to the properly-inserted position can be carried out more easily and positively as compared with the case where such an operation is effected manually.

The correcting operation for moving the metal terminals, disposed in an improperly-inserted position, to the properly-inserted position, and the examination operation for judging the conducting condition of the wire harness, including the metal terminals, can be carried out at the same time.

Further objects, features and advantages of the present invention will become apparent from the detailed description of preferred embodiments which follows, when considered together with the attached figures of drawings.

BRIEF DESCRIPTION OF THE DRAWINGS

The invention will be described in detail with reference to the following drawings, wherein.

DETAILED DESCRIPTION OF PREFERRED EMBODIMENTS

Figure 1:
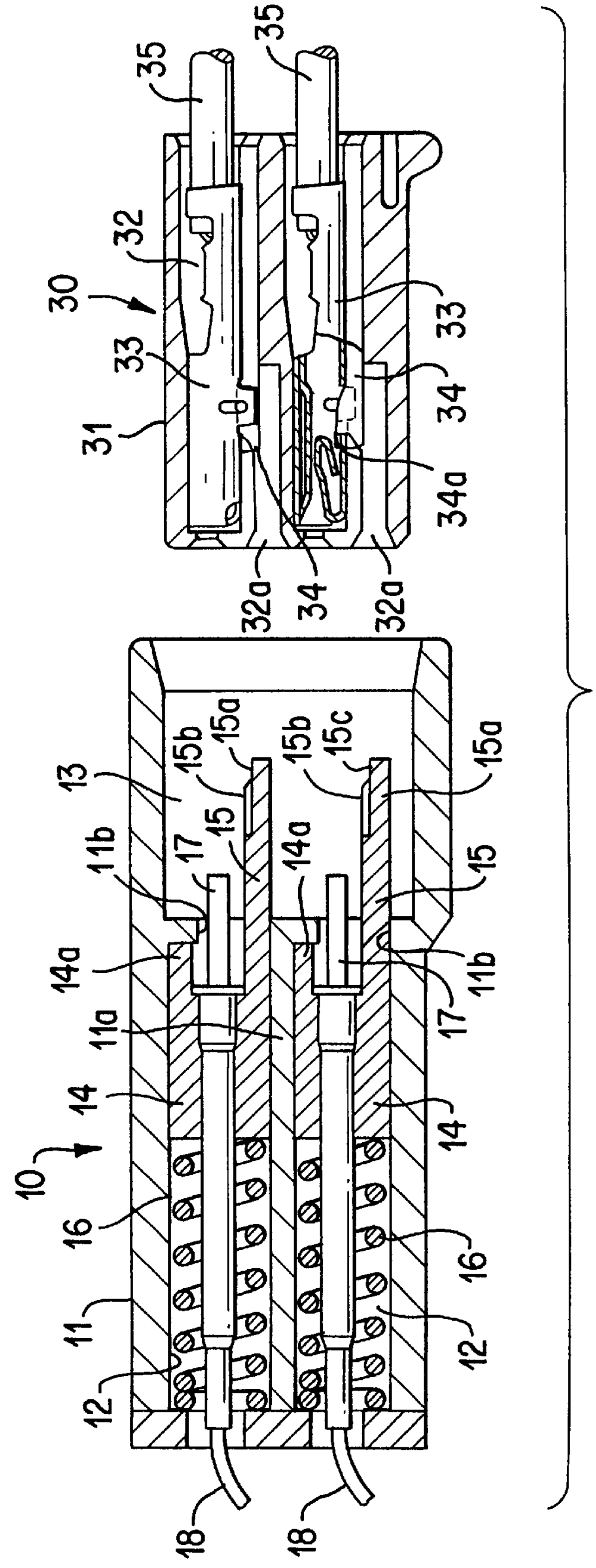
FIG. 1 is a cross-sectional view showing a first embodiment of a connector examination device of the present invention.
Figure 2:
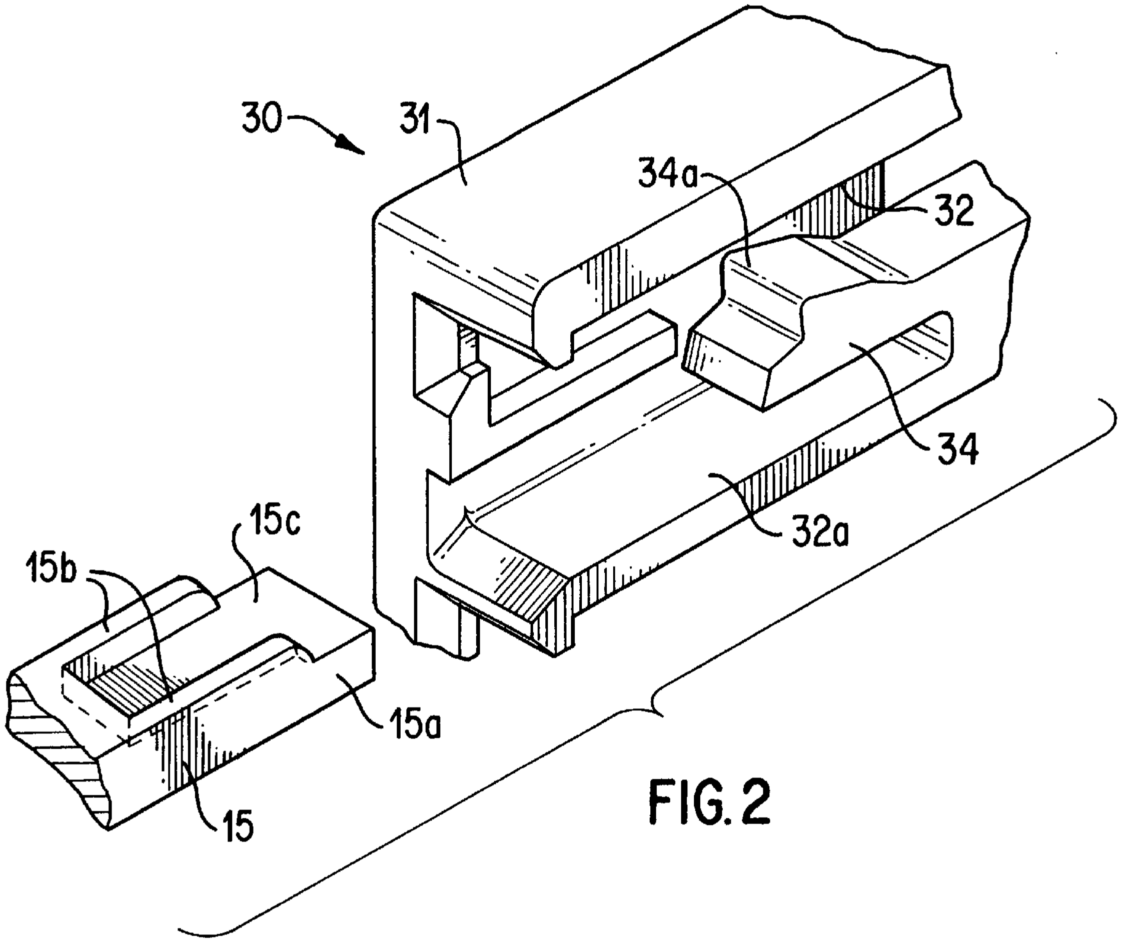
FIG. 2 is a fragmentary, enlarged view showing a lance of a connector and a lance check pin.

A first embodiment of the terminal inspecting apparatus and method aspects of the present invention will now be described with reference to FIGS. 1 to 5.

Reference is first made to the construction of a connector 30 to be examined by the use of an examination device 10.

A connector housing 31 is molded of a resin, and has a rectangular configuration as a whole. A plurality of cavities 32 are formed in the connector housing, and are arranged in upper and lower stages. Each cavity 32 extends through the connector housing from its front to its rear end, and a metal terminal 33 is inserted into the cavity 32 from a rear side (i.e., the right side in FIG. 1). The metal terminal 33, having a wire 35 compressively connected thereto, is of a known construction, and is of the female type that mates with a male metal terminal of a mating connector (not shown).

Lances 34 for retaining the respective metal terminals 33 against withdrawal are formed integrally on the connector housing 31. The lance 34 is in the form of an elastically-deformable projecting piece, and has a retaining portion 34*a* formed adjacent to its distal end. The retaining portion 34*a* projects toward the associated cavity 32.

A lance flexing space 32*a* for allowing downward elastic deformation of the lance 34 is provided within the cavity 32, the lance flexing space being formed utilizing a mold release space. The lance flexing space 32*a* is open to the front end face of the connector housing 31, and has upper and lower inner surfaces parallel to each other.

Figure 4:
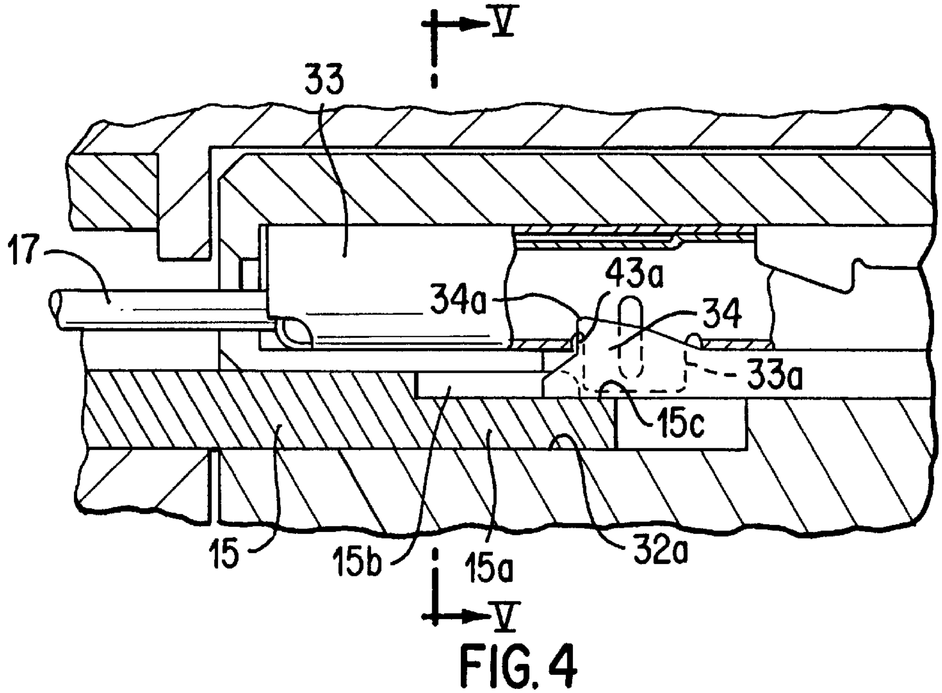
FIG. 4 is an enlarged, cross-sectional view showing the positional relation between the lance and the lance check pin in an upper stage of FIG. 3.
Figure 5:
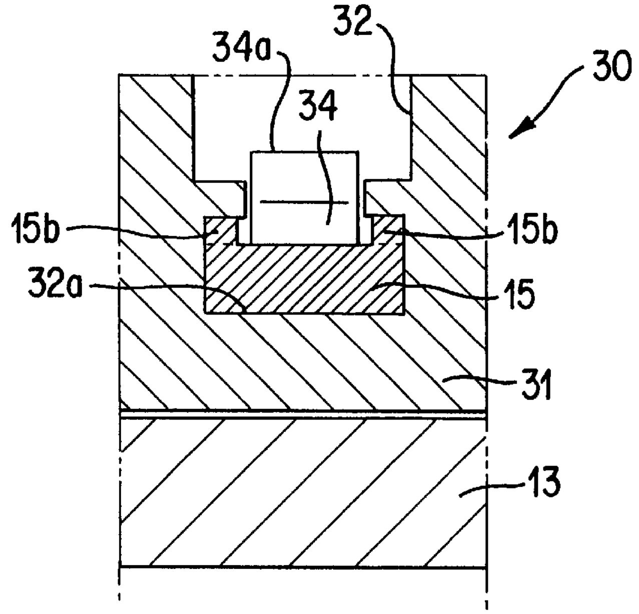
FIG. 5 is a cross-sectional view taken along the line V—V of FIG. 4.

As will be more fully described later, when the lance 34 holds the metal terminal 33, inserted into a proper position, against withdrawal, a lower surface of the lance 34 is disposed parallel to the lower inner surface of the lance flexing space 32*a*. The lower surface portion of the lance 34 projects downwardly into the upper inner surface of the lance flexing space 32*a* (FIG. 4).

When the metal terminal 33 is inserted into the cavity 32, the distal end of the metal terminal 33 abuts against the lance 34 during the insertion to urge the lance 34 downward, so that the lance 34 is elastically deformed and projected into the lance flexing space 32*a*. When the metal terminal 33 is inserted into an innermost portion of the cavity 32, the lance 34, elastically deformed during the insertion, is retracted upwardly from the lance flexing space 32*a*, that is, restored to its initial position as a result of engagement of the retaining portion 34*a* in an engagement hole 43*a* in the metal terminal 33, thereby retaining the metal terminal 33 against withdrawal.

To indicate the condition of engagement of the lance 34, the metal terminal 33 in the upper stage (FIG. 3) is shown as inserted into a proper position to be completely engaged with the lance 34, while the metal terminal 33 in the lower stage is shown as disposed in an incompletely-inserted position short of the properly position, with the lance 34 elastically deformed into the lance flexing space 32*a*.

Next, an examination device 10 for examining the above connector 30 will be described. The examination device 10 is incorporated in an inspection or checker housing 11 made of a resin. The interior of the inspection housing 11 is divided by partition walls 11*a* into a plurality of smaller chambers forming cavities 12 corresponding in number to the cavities 32 in the connector housing 31. The inspection housing has a hood portion 13 of a generally square or rectangular shape disposed adjacent to front ends of the cavities 12, the hood portion 13 serving as a set portion for receiving the connector housing 31 of the connector 30.

A slider 14, having excellent sliding properties, is mounted within each cavity 12 for sliding movement therealong, and a lance check pin 15, formed integrally with the slider, projects into the hood portion 13 through a through hole 11*b* formed in the partition wall 11*a*. A relatively weak compression spring 16 mounted within the cavity 12 normally urges the slider 14 to a right side in FIG. 1. When the connector 30 is not placed in the hood portion 13, the lance check pin 15 fully projects into the hood portion 13 in such a manner that a stopper 14*a*, formed on the slider 14 in a projected manner, abuts against the partition wall 11*a*. The lance check pin 15 is disposed in such a position that it can be inserted into the lance flexing space 32*a* in the connector housing 31 set in the hood portion 13.

The lance check pin 15, when inserted into the lance flexing space 32*a*, moves in sliding contact with the upper and lower inner surfaces of the lance flexing space. Even when the lance 34 retains the metal terminal 33 against movement from the normal position, the lance 34 slightly projects into the lance flexing space 32*a* as described above. In this connection, a distal end portion 15*a* of the lance check pin 15 is cut at its upper surface to be reduced in thickness. Therefore, the lance check pin 15 can be inserted into a position where its distal end portion 15*a* underlies the lance 34. With this construction, when the metal terminal 33 is disposed in an incompletely-inserted position, with the lance 34 flexed and projection into the lance flexing space 32*a*, the distal end of the lance check pin 15 abuts against the distal end of the lance 34.

In this embodiment, the lance check pin 15 is provided with means by which its distal end portion 15*a* can be smoothly brought into underlying relation to the lance 34. This construction will now be described.

Elongate, wall-like guide portions 15*b* and 15*b* are respectively formed on and extend along lateral marginal portions (except for a widthwise central portion registrable with the lance 34) of the upper surface of the distal end portion 15*a* of the lance check pin 15 that can face the lower surface of the lance 34. The guide portions 15*b* extend parallel to the direction of the length of the lance check pin 15. Upper surfaces of the guide portions 15*b* are flush and continuous with the upper surface of that portion of the lance check pin 15 extending rearwardly from the distal end portion thereof, and can be brought into contact with the upper inner surfaces of the lance flexing space 32*a*.

Distal ends of the guide portions 15*b* terminate a predetermined distance short of the distal end of the lance check pin 15 to provide a relief recess 15*c* for preventing the guide portions 15*b* from interfering with stabilizers 33*a* that project from the metal terminal 33 along the opposite sides of the lance 34.

An electrical contact member 17, comprising an electrically-conductive bar, is fixedly mounted on the slider 14, for example, by press-fitting. The electrical contact member 17 extends parallel to the lance check pin 15, and a length of the contact member 17 is shorter than that of the lance check pin 15. The position of the distal end of the electrical contact portion 17 is so determined that when the connector housing 31 is set in the hood portion 13, so that the distal end portion 15*a* of the lance check pin 15 is brought into underlying relation to the lance 34, with the metal terminal 33 disposed in the proper position, the electrical contact member 17 contacts the distal end of the metal terminal 33.

Each of the electrical contact members 17 is connected to a conduction examination circuit (not shown) via a lead wire 18. This conduction examination circuit judges whether the metal terminals 33 are properly inserted respectively into the cavities 32 in the connector 30 assembled as a wire harness. The conduction examination circuit is a known construction and incorporates a power source for conduction examination purposes, and effects an examination by judging whether electric current can flow between predetermined metal terminals of the two connectors connected respectively to the opposite ends of the wire harness.

Next, the operation of this embodiment will be described. The metal terminals 33, compressively connected to respective ends of the wires 35, are inserted respectively into their associated cavities 32 in the connector housing 31, and the wires 35 are combined together into a bundle by tape or the like, thereby assembling the wire harness. In this condition, the examination for improper attachment of the metal terminals 33, as well as conduction examination, are carried out in the following manner. The wire harness to be examined is placed on a predetermined examination plate, and the connector 30 is set in the hood portion 13 of the inspection housing 11 of the connector examination device 10 (see FIG. 3).

At this time, if the metal terminal 33 of the connector 30 is disposed in the proper position where it is engaged with the lance 34 of the connector housing 31 as shown in the upper stage of FIG. 3, the lance 34 is retracted upwardly, and projects slightly into the lance flexing space 32*a*, thereby opening the lance flexing space 32*a* disposed below the lance 34. Therefore, the lance check pin 15, inserted into the lance flexing space 32*a* upon setting of the connector 30, will not abut against the lance 34, and the distal end portion 15*a* of the lance check pin 15 is brought into underlying relation to the lance 34, with the two guide portions 15*b* and 15*b* disposed adjacent respectively to the opposite lateral sides of the lance 34.

As a result, by the urging force of the spring 16, the slider 14 is moved forward in such a manner that the lance check pin 15 is fully projected into the hood portion 13 of the checker housing 11. As a result, the electrical contact member 17, movable with the slider 14, is also projected a maximum distance toward the connector 30, so that the distal end of the contact member is brought into contact with the distal end of the metal terminal 33, thus making an electrical connection therebetween. Therefore, it is confirmed by the conduction examination circuit that the metal terminal 33 is disposed in the proper position and that the metal terminal is mounted in the predetermined cavity 32.

Figure 3:
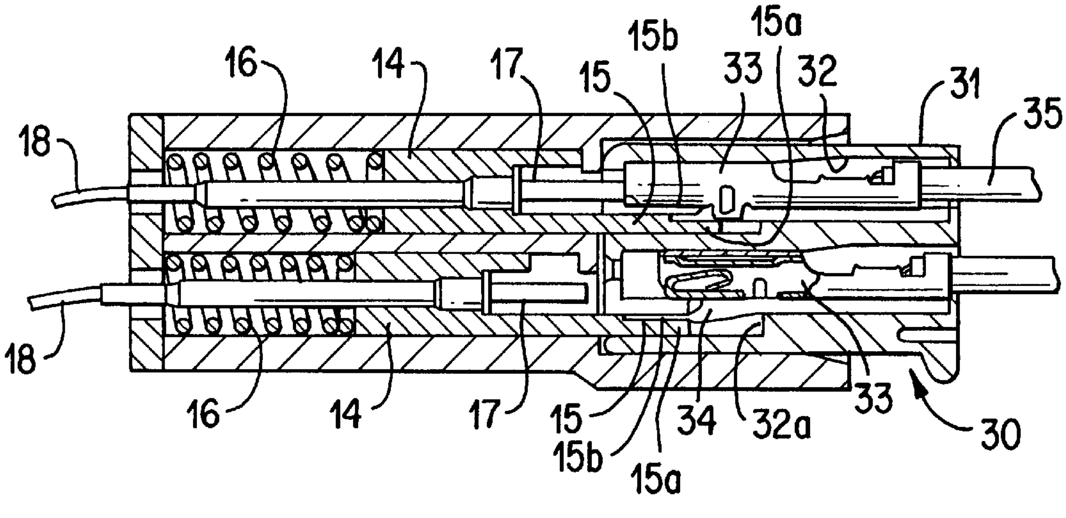
FIG. 3 is a cross-sectional view of the examination device, showing a condition in which the connector is set.

By contrast, if the metal terminal 33 is disposed in an incompletely-inserted position where it does not contact the lance 34, as shown in the lower stage of FIG. 3, the lance 34 is pressed down by this metal terminal 33, and projects into the lance flexing space 32*a*. Therefore, when the connector 30 is set in the hood portion 13 of the checker housing 11, the distal end portion 15*a* of the lance check pin 15 abuts against the distal end of the lance 34, and can not be brought into underlying relation with respect to the lance 34.

Therefore, during the setting of the connector 30, the lance check pin 15 is prevented from advancing in the lance flexing space 32*a*, and the slider 14 is urged left (FIG. 3) relative to the checker housing 11 while compressing the compression spring 16. Therefore, the electrical contact member 17, integrally mounted on the slider 14, is also urged left, and can not contact the metal terminal 33, thus failing to achieve an electrical connection to the metal terminal 33. This abnormality encountered with the metal terminal 33 is detected by the conduction examination circuit.

When the lance 34 is urged down into the lance flexing space 32*a* as described above, the distal end of the lance check pin 15 abuts against the lance 34, and therefore an insertion resistance, produced when setting the connector 30 into the hood portion 13 of the checker housing 11, is increased. Despite this, the setting should be continued. Because the lance check pin 15 is urged left while compressing the compression spring 16, an excessive pressure will not be exerted on the lance 34, and damage to the lance 34 is thereby prevented.

In the above examination, there are occasions when the distal end portion 15*a* of the lance check pin 15 to be inserted into the lance flexing space 32*a* in the connector 30 is deformed or bent upwardly, or is obliquely and/or upwardly inserted into the lance flexing space 32*a*. Even in such a case, upon insertion of the lance check pin 15 into the lance flexing space 32*a*, the upper surfaces of the guide portions 15*b* contact the upper inner surface of the lance flexing space 32*a* over a predetermined length in the direction of the length of the lance check pin 15. In addition the lower surface of the lance check pin 15 contacts the lower inner surface of the lance flexing space 32*a*. Therefore, the lance check pin 15 is corrected into a proper posture, and can be inserted into the lance flexing space 32*a* while being guided by guide portions 15*b* to this posture.

As described above, in this embodiment, when the metal terminal 33 is disposed in the proper position, the distal end portion 15*a* of the lance check pin 15 can be positively brought into the position beneath the lance 34. Therefore, to misjudge that the metal terminal 33 is disposed in an incompletely-inserted position, although the metal terminal is actually disposed in the proper position, is prevented, and the highly-reliable examination can be carried out.

In addition, the relief recess 15*c* is provided at the distal end portion 15*a* of the lance check pin 15, and when the distal end portion 15*a* of the lance check pin 15 is brought into underlying relation to the lance 34, the guide portions 15*b* of the lance check pin 15 will not interfere with the stabilizers 33*a* of the metal terminal 33, thereby preventing a situation in which the advance of the lance check pin 15 is prevented by the interference of the guide portions 15*b* with the stabilizers 33*a*.

The electrical contact members 17 can be connected to the conduction examination circuit for the wire harness, and by performing one operation, that is, the setting of the connector 30 in the inspection housing 11, the position of the lance 34 (that is, whether each metal terminal 33 is disposed in the proper position) and whether each metal terminal 33 is mounted in the predetermined cavity 32 can be confirmed at the same time, and the examination operation is made reliable and efficient.

Furthermore, the sliders 14 are mounted respectively in the cavities 12 in the inspection housing 11, and the lance check pin 15 and the electrical contact member 17 are integrally provided on each slider to provide a single unit. Therefore, it is only necessary to provide units corresponding in number to the number of poles of the connector 30 to be examined. The integral check pin and electrical contact member 17 can be adapted for inspection of any type of connector. In the event of a malfunction, it is only necessary to exchange such a defective unit, and therefore the maintainability is excellent.

Figure 6:
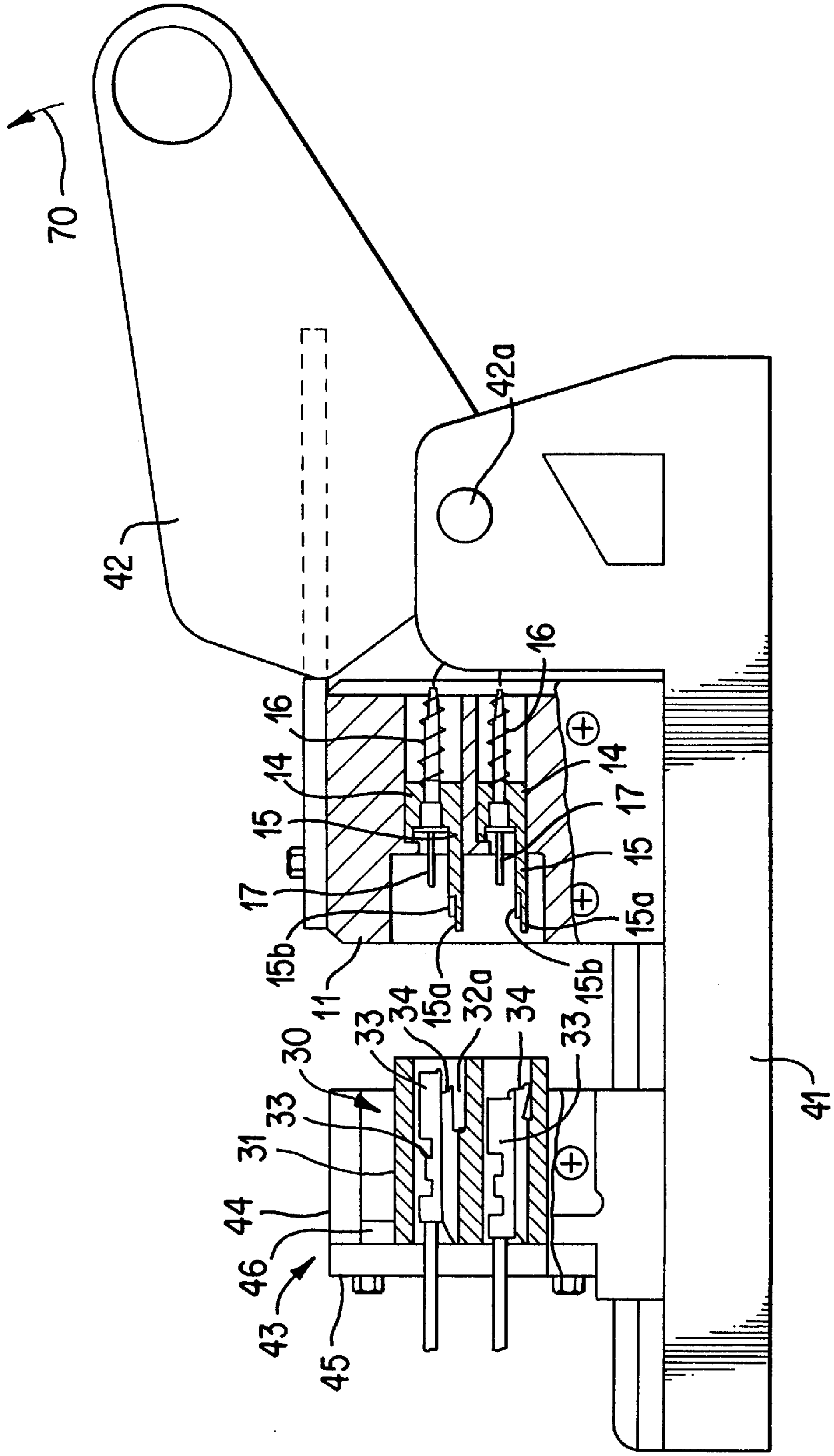
FIG. 6 is a cross-sectional view of a second embodiment of a connector examination device of the invention.
Figure 7:
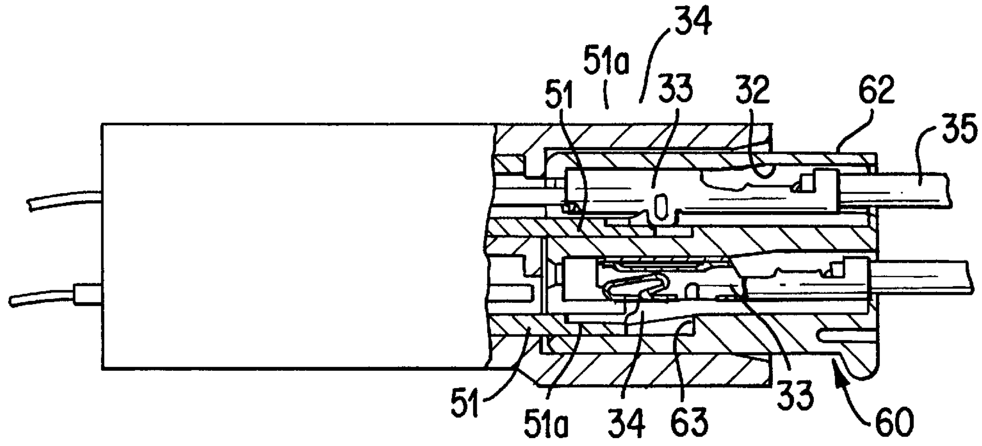
FIG. 7 RELATED ART
FIG. 7 is a cross-sectional view of a connector examination device shown for comparison purposes.
Figure 8:
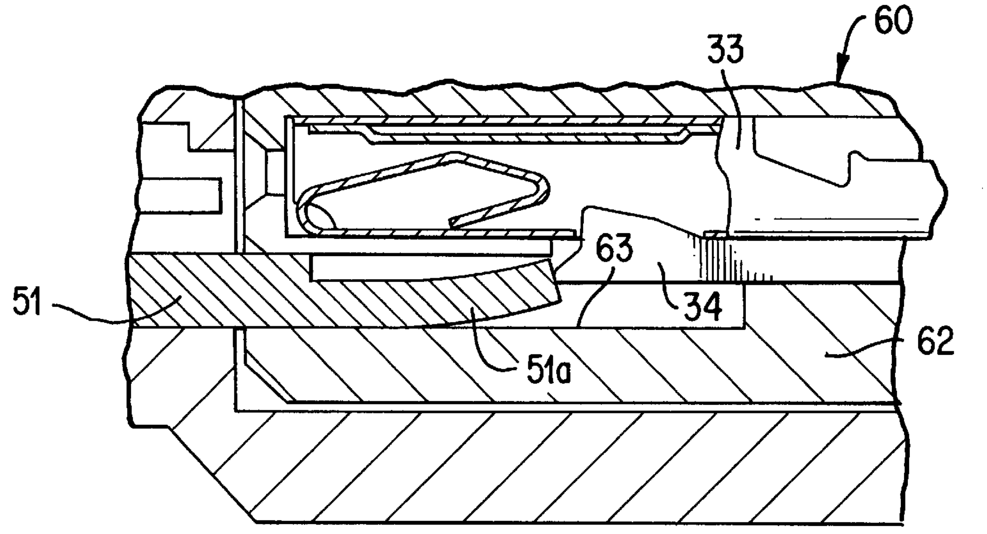
FIG. 8 RELATED ART
FIG. 8 is an enlarged, cross-sectional view of a portion of FIG. 7.

FIG. 6 shows a second embodiment of the terminal inspecting apparatus and method aspects of the present invention. The basic difference from the above embodiment is that this embodiment is of such a construction that an inspection housing 11 is mechanically moved toward a connector 30. Other elements are similar to those of the first embodiment and, therefore, to avoid repeated explanation, identical portions are denoted by the same reference numerals, respectively, and only different portions will be described in detail.

The inspection housing 11 is mounted on a base plate 41 for movement to the right and left in FIG. 6, and is moved by pivotally rotating a cam handle 42 about a shaft 42*a* mounted on the base plate 41. Lance check pins 15 and electrical contact members 17 used in this embodiment are the same as those in the preceding embodiment.

A connector holder 43 is fixedly mounted on a left end portion (FIG. 6) of the base plate 41. The connector holder 43 comprises a U-shaped support block 44, a U-shaped back plate 45 releasably mounted on the support block 44, and an upwardly-open connector fixing groove 46 is provided between the support block and the back plate. Elongate protuberances (not shown) formed on an outer surface of the connector housing 31 are fitted in the connector fixing groove 46 from the upper side, and the two elongate protuberances are vertically guided by it, so that the connector housing 31 received by the support block 44 is retained in position. In this condition, the connector housing 31 is immovable in right and left directions.

The connector 30, manually or by machine, is fitted or set in the connector holder 43 from the upper side. When the cam handle 42 is pivotally moved in a direction of an arrow 70 to move the inspection housing 11 to the right in FIG. 6, each of the lance check pins 15 and the associated electrical contact members 17 are moved toward the connector 30, and the distal end portion of the lance check pin 15 is inserted into a lance flexing space 32*a* beneath a lance 34. The electrical contact member 17 is moved toward an associated metal terminal 33, as described above for the preceding embodiment. As a result, the condition of attachment of each metal terminal 33, as well as the connection of the metal terminal 33, is checked.

In this embodiment, also, guide portions 15*b* for keeping the lance check pin 15 in a proper position in the lance flexing space 32*a* are formed at a distal end portion 15*a* of the lance check pin 15. Therefore, when the metal terminal 33 is disposed in a proper position, the distal end portion 15*a* of the lance check pin 15 can be positively brought into a position beneath the lance 34. This eliminates the possibility that it is judged that the metal terminal is disposed in an incompletely-inserted position when the metal terminal 33 is disposed in the proper position, and therefore highly reliable examination can be carried out.

In FIG. 6, the inspection housing 11 is moved by pivotally moving the cam handle 42; however, in contrast with this, the checker housing 11 may be fixed while the connector holder 43 holding the connector 30 may be moved, or the two may be moved toward each other.

In addition, the judgment means for judging from the position of the lance check pin 15 may be achieved using devices other than the electrical contact member 17 that is mounted for movement with the lance check pin 15.

Figure 9:
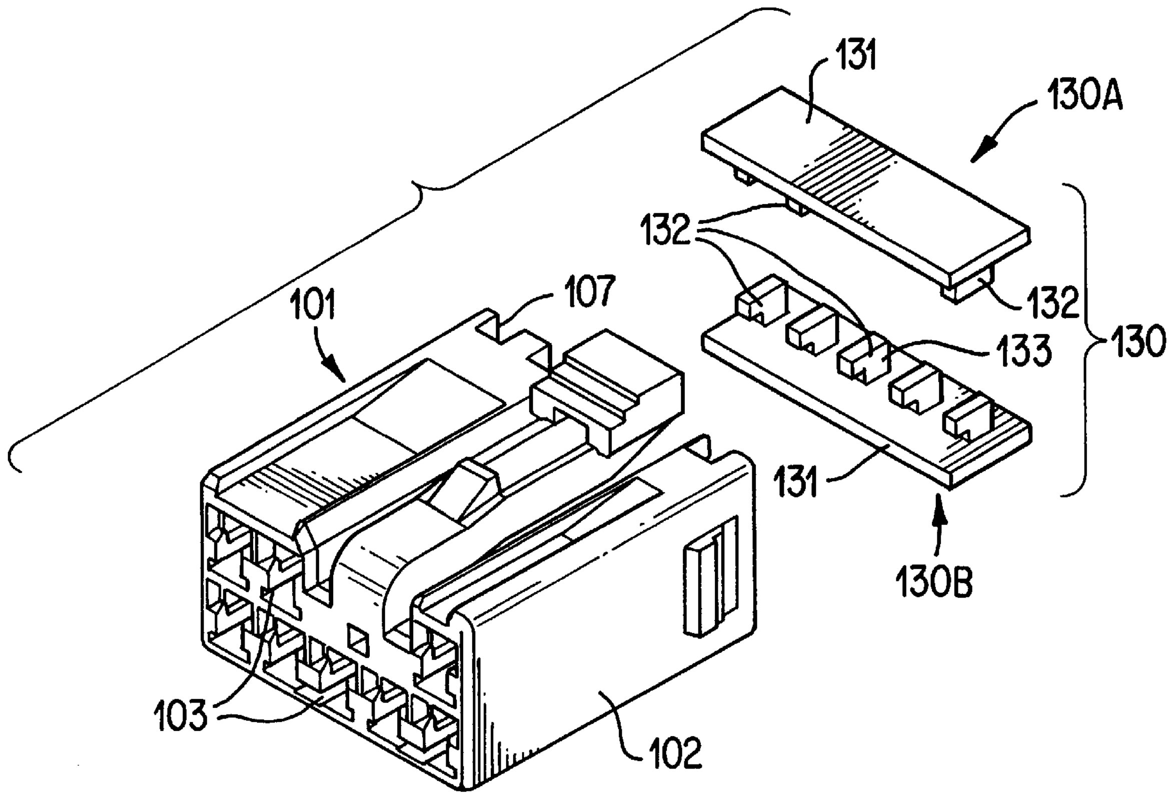
FIG. 9 is a perspective view of a connector and the terminal correcting apparatus.

A first embodiment of the inspecting and correcting apparatus and method aspects of the present invention will now be described with reference to FIGS. 9, 10(A) and 10(B). Reference is first made to a connector 101 in which a metal terminal-correcting jig 130 of this embodiment is used. A connector housing 102 of a generally square configuration is molded of a plastics material, and the interior of the connector housing 102 is divided into two stages each having a plurality of cavities 103. Each cavity 103 extends through the connector housing 102 from its front to its rear end, and a metal terminal 33 is inserted into the cavity 103 from an insertion hole 104 open to a rear side (i.e., the right side in FIG. 10(A)) of the cavity. When the metal terminal 33 is inserted in the cavity 103, a wire 112, fixedly secured to a rear end portion of the metal terminal 33, extends to the exterior of the connector housing 104 through the insertion hole 104.

An elastically-deformable lance 34 for retaining the metal terminal 33 against withdrawal is provided within the cavity 103. An engagement portion 111 for engagement with the lance 34 is provided on the metal terminal 33, the engagement portion 111 being formed by removing part of the surface of the metal terminal.

As the metal terminal 33 is inserted into the cavity 103, the lance 34 is elastically deformed away from the metal terminal 33 by contact with the outer surface of the metal terminal 33 until the inserted metal terminal 33 reaches a properly-inserted position. When the metal terminal 33 reaches the properly-inserted position, the lance 34 becomes engaged with the engagement portion 111 because of its elastic restoring force, thereby retaining the metal terminal 33 against withdrawal.

Figure 10A:
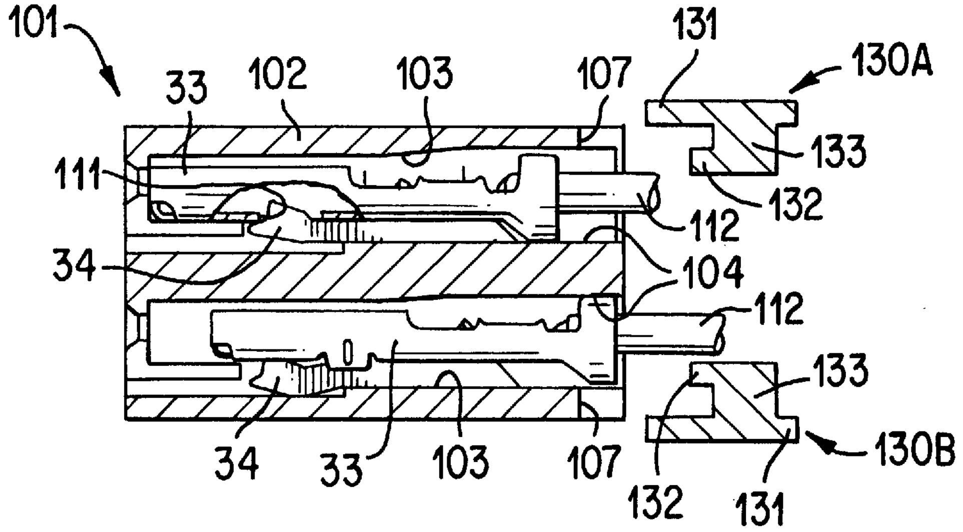
FIGS. 10(A) and 10(B) are sequential, cross-sectional views of the terminal correcting apparatus in FIG. 9.
Figure 10B:
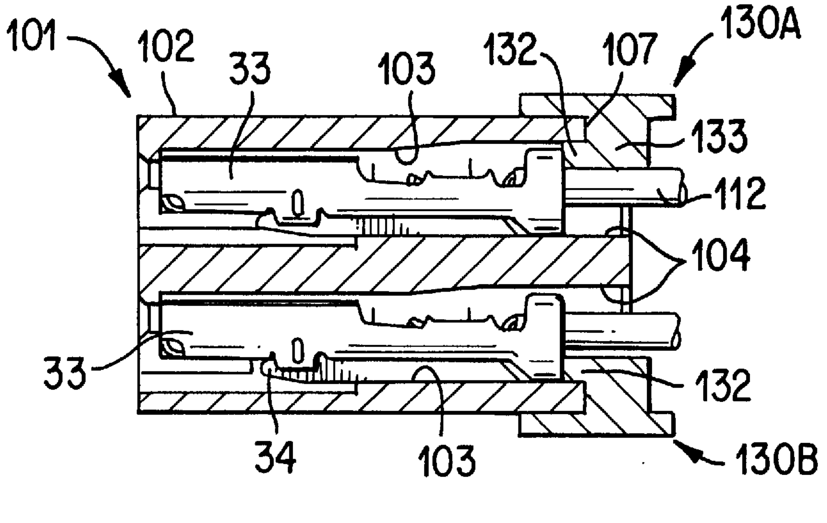

To indicate the condition of the lance 34, the metal terminal 33 in the upper stage (FIG. 10(A)) of the connector 101 is shown as inserted into the properly-inserted position, with the lance 34 engaged with the engagement portion 111, while the metal terminal in the lower stage is shown as disposed in an improperly-inserted position short of the properly-inserted position, with the lance 34 disengaged with the engagement portion 111.

Next, the metal terminal-correcting jig of this embodiment will be described. In this embodiment, in accordance with the two-stage arrangement of the cavities 103, two metal terminal-correcting jigs 130A and 130B are provided. Each of the metal terminal-correcting jigs 130A and 130B includes a plurality of L-shaped pressing portions 132 that are formed on and project from one side of a base plate 131, and are arranged and juxtaposed in a manner similar to the arrangement of the cavities 103 of the corresponding stage. The bent distal end of each pressing portion 132 projects parallel to the surface of the base plate 131.

The metal terminal-correcting jigs 130A and 130B can be attached to the connector housing 102 from a rear side thereof, and the attached jigs can be removed from the connector housing. When the metal terminal-correcting jigs 130A and 130B are attached to the connector housing 102, the pressing portions 132 are fitted respectively in the cavities 103 through the respective insertion holes 104, and are directed forwardly. If the metal terminals 33, inserted in the respective cavities 103, are disposed in their properly-inserted position, the distal end of the corresponding pressing portion 132 inserted into the cavity 103 abuts against the rear end of the associated metal terminal 33 when the metal terminal-correcting jigs 130A and 130B are completely attached into their finally-attached position. If the metal terminal 33 is disposed in an improperly-inserted position short of the properly-inserted position, the pressing portion is brought into abutment against the rear end of the metal terminal 33 before the metal terminal-correcting jig 130A, 130B reaches the finally-attached position.

The connector housing 102 is notched over an area extending from the outer surface thereof to each insertion hole 104 to form a guide portion 107 that fits on a proximal portion 133 of the pressing portion 132 of the metal terminal-correcting jig 130. The proximal portion 133 of the pressing portion 132 is fitted in the guide portion 107, thereby guiding the pressing portion 132 into the cavity 103.

Next, the operation of this embodiment will be described. The metal terminals 33 are inserted respectively into the cavities 103 in the connector housing 102, the two metal terminal-correcting jigs 130A and 130B are attached to the connector housing 102 from the rear side thereof, and the pressing portions 132 are forced into the cavities 103, respectively, while being fitted in and guided by the respective guide portions 107. At this time, if any of the metal terminals 33 is disposed in an improperly-inserted position, the distal end of the corresponding pressing portion 132 abuts against the rear end of this improperly-inserted metal terminal 33 before the metal terminal-correcting jig 130 reaches its finally-attached position, and the pressing portion moves while urging the metal terminal forwardly, that is, toward the inner end of the cavity 103. When the metal terminal-correcting jig 130A reaches the finally-attached position, the metal terminal 33, disposed in the improperly-inserted position, is brought into the properly-inserted position as shown in FIG. 10(A), and the lance 34 engages the engagement portion 111 thereof, thereby retaining the metal terminal against withdrawal.

With respect to the metal terminals 33, which have been completely inserted into their respective properly-inserted position from the beginning upon insertion into their respective cavities 103, their mating pressing portions 132 abut respectively against the rear ends of these metal terminals 33 when the metal terminal-correcting jigs 130A and 130B are completely attached in their finally-attached position.

After the metal terminal-correcting jigs 130A and 130B are thus attached to the connector housing 102, the metal terminal-correcting jigs 130A and 130B are removed from the connector housing 102. At this time, because the pressing portions 132 of the metal terminal-correcting jigs 130A and 130B are merely abutted against the metal terminals 33, respectively, each metal terminal 33 is not subjected to a force acting in a direction of withdrawal of the metal terminal 33 from the cavity 103 when the metal terminal-correcting jig 130A, 130B is removed. Therefore, all of the metal terminals 110 attached to the connector housing 102 are held by the respective lances 34 in the properly-inserted position against withdrawal.

As described above, if any of the metal terminals 33 is disposed in an improperly-inserted position, the metal terminal-correcting jig 130A, 130B can move this metal-terminal into the properly-inserted position. Therefore, in contrast with the conventional construction in which it is only possible to check those metal terminals, disposed at an improperly-inserted position, by the use of a retainer, it is not necessary to again effect the insertion of the metal terminals and to again check the condition of insertion of the metal terminals. By the use of the metal terminal-correcting jigs 130A and 130B, the overall inserting operation for the metal terminals 33 can be effected with high efficiency.

The metal terminal-correcting jigs 30A and 30B of this embodiment, after attached to the connector housing 102, can be removed therefrom, and therefore the same metal terminal-correcting jigs 130A and 130B can be used repeatedly for a number of connectors 101, and there is no need to prepare as many sets of metal terminal-correcting jigs 130A and 130B as the connectors 101. Therefore, by using the metal terminal-correcting jigs 130A and 130B of this embodiment, the number of the required parts can be reduced, and hence the cost can be reduced.

Figure 11:
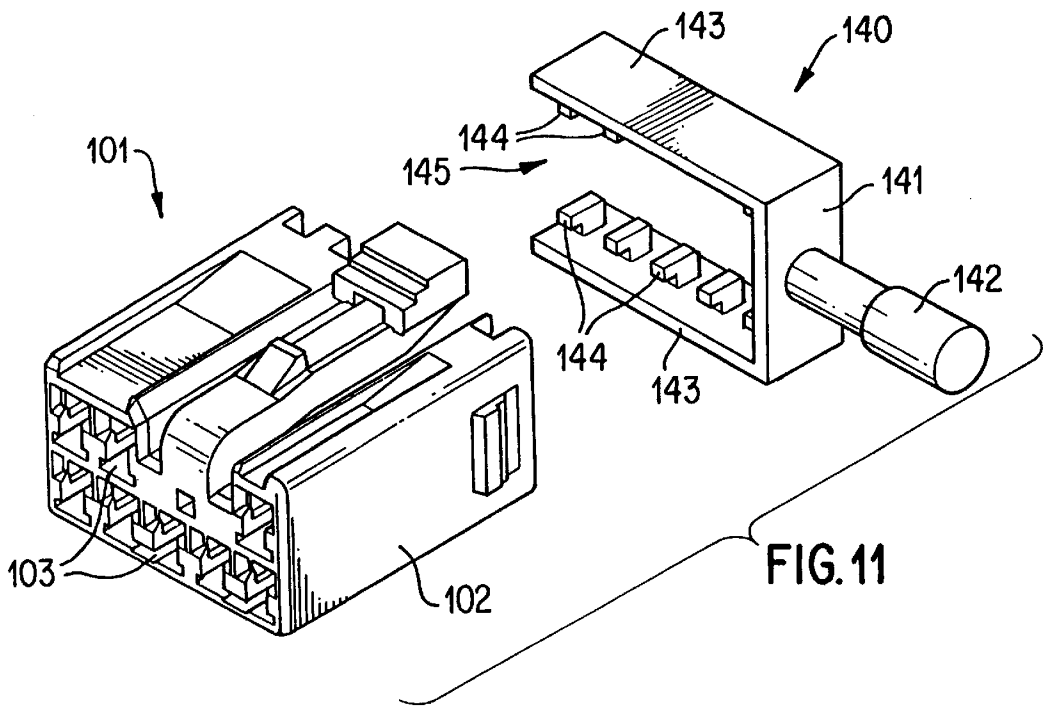
FIG. 11 is a perspective view of a connector and another embodiment of the terminal correcting apparatus.

Another embodiment of the inspecting and correcting apparatus and method will now be described with reference to FIG. 11.

A metal terminal-correcting jig 140 of this embodiment is adapted to be attached to the same connector 101 as in the first embodiment. The connector has a plurality of cavities 103 arranged in two stages. The metal terminal-correcting jig 140 comprises a base member 141 of a generally recumbent U-shape, and a bar-like grip 142 extending from this base member. The base member 141 has two parallel base plate portions 143 and 143 extending in a cantilever manner in a direction away from the grip 142, and a plurality of pressing portions 144 are formed on and project from opposed surfaces of the base plate portions, and are arranged in a manner corresponding to the arrangement of the cavities 103. An open relief portion 145 is formed between the distal end portions of the two base plate portions 143 and 143 of the metal terminal-correcting jig 140. The relief portion 145 prevents the metal terminal-correcting jig 140 from interfering with wires (not shown in FIG. 11) of metal terminals mounted in the connector housing 102 when this jig is to be attached to the connector housing 102.

When the metal terminal-correcting jig 140 is to be attached to the connector housing 102, the two base plate portions 143 and 143 are so positioned that the wires, extending rearwardly from the connector housing 102, are disposed between the two base plate portions 143 and 143, and the pressing portions 144 are fitted in the cavities 103, respectively. Here, for positioning the metal terminal-correcting jig 140 in straddling relation to the wires, the relief portion 145 is disposed in facing relation to the lateral sides of the wires, and then the metal terminal-correcting jig 140 is moved perpendicularly to the wires, so that the wires are received in a space between the two base plate portions 143 and 143. By doing so, interference between the metal terminal-correcting jig 140 and the wires can be avoided.

For removing the metal terminal-correcting jig 140 from the connector housing 102 after the jig is attached to the latter, the metal terminal-correcting jig 140 is moved perpendicularly to the wires in such a manner that the wires are moved out of the space, between the two base plate portions 143 and 143, through the relief portion 145. Interference between the metal terminal-correcting jig 140 and the wires can be avoided.

Figure 12:
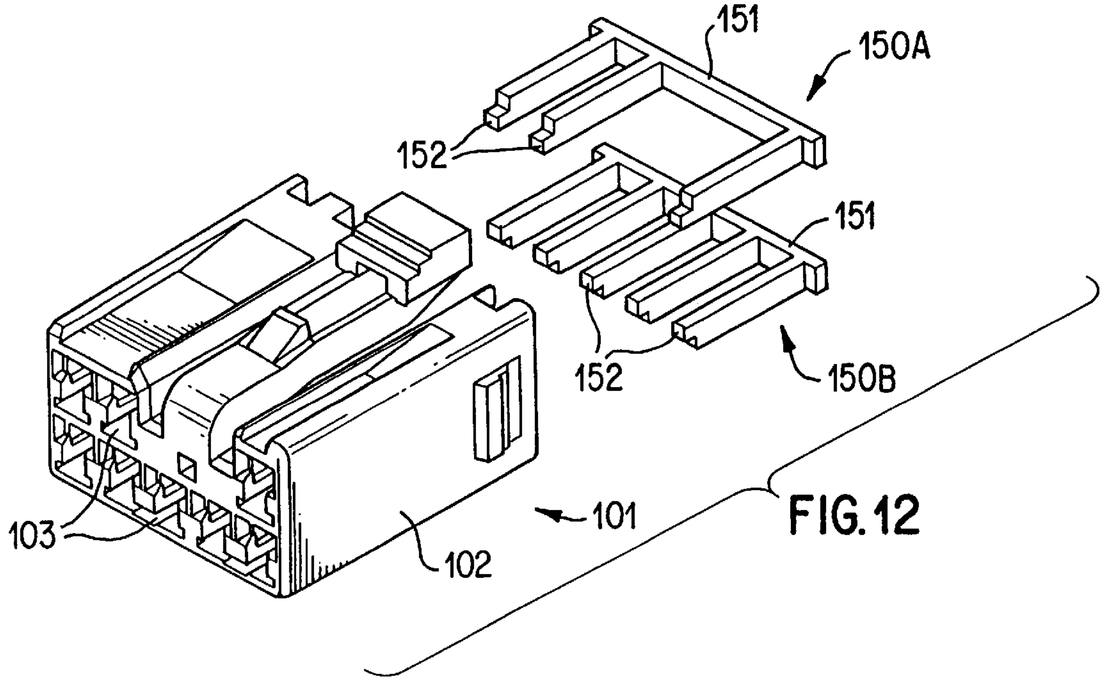
FIG. 12 is a perspective view of a connector and yet another embodiment of the terminal correcting apparatus.

Another embodiment of the inspecting and correcting apparatus will now be described with reference to FIG. 12. Two metal terminal-correcting jigs 150A and 150B are used as one set. The metal terminal-correcting jigs 150A and 150B are attached to the same connector 101 (having a plurality of cavities 103 arranged in two stages) in such a manner that each metal terminal-correcting jig cooperates with the cavities of the corresponding stage. Each of the metal terminal-correcting jigs 150A and 150B has a base member 151 in the form of an elongate bar, and a plurality of juxtaposed elongate pressing portions 152 are formed on and project from one side of the base member 151. The pressing portions are arranged in a manner corresponding to the arrangement of the cavities 103 of the corresponding stage. Thus, each of the jigs assumes a comb-shape as a whole.

The metal terminal-correcting jigs 50A and 50B are attached to the connector housing 102 from a rear side thereof in such a manner that the pressing portions 152 are forced into the cavities 103, respectively. If any of metal terminals (not shown) inserted in the respective cavities 103 is disposed in an improperly-inserted position, such a metal terminal is urged by the distal end of the pressing portion 152 to be moved into a properly-inserted position, and is held there against withdrawal by a lance (not shown). Thereafter, the metal terminal-correcting jigs 150A and 150B are removed from the connector housing 102, and are used for attachment to another connector.

Another embodiment of the inspecting and correcting apparatus will now be described with reference to FIG. 13. A connector examination device 160 of this embodiment comprises a metal terminal-correcting jig 162 fixedly mounted on a base plate 61 adjacent to one end thereof, a connector holder 164 that is mounted on a rail 163 for movement toward and away from the metal terminal-correcting jig 162, and is urged in a direction away from the metal terminal-correcting jig 162, and a cam handle 165 for moving the connector holder 164 toward the metal terminal-correcting jig 162.

Figure 13:
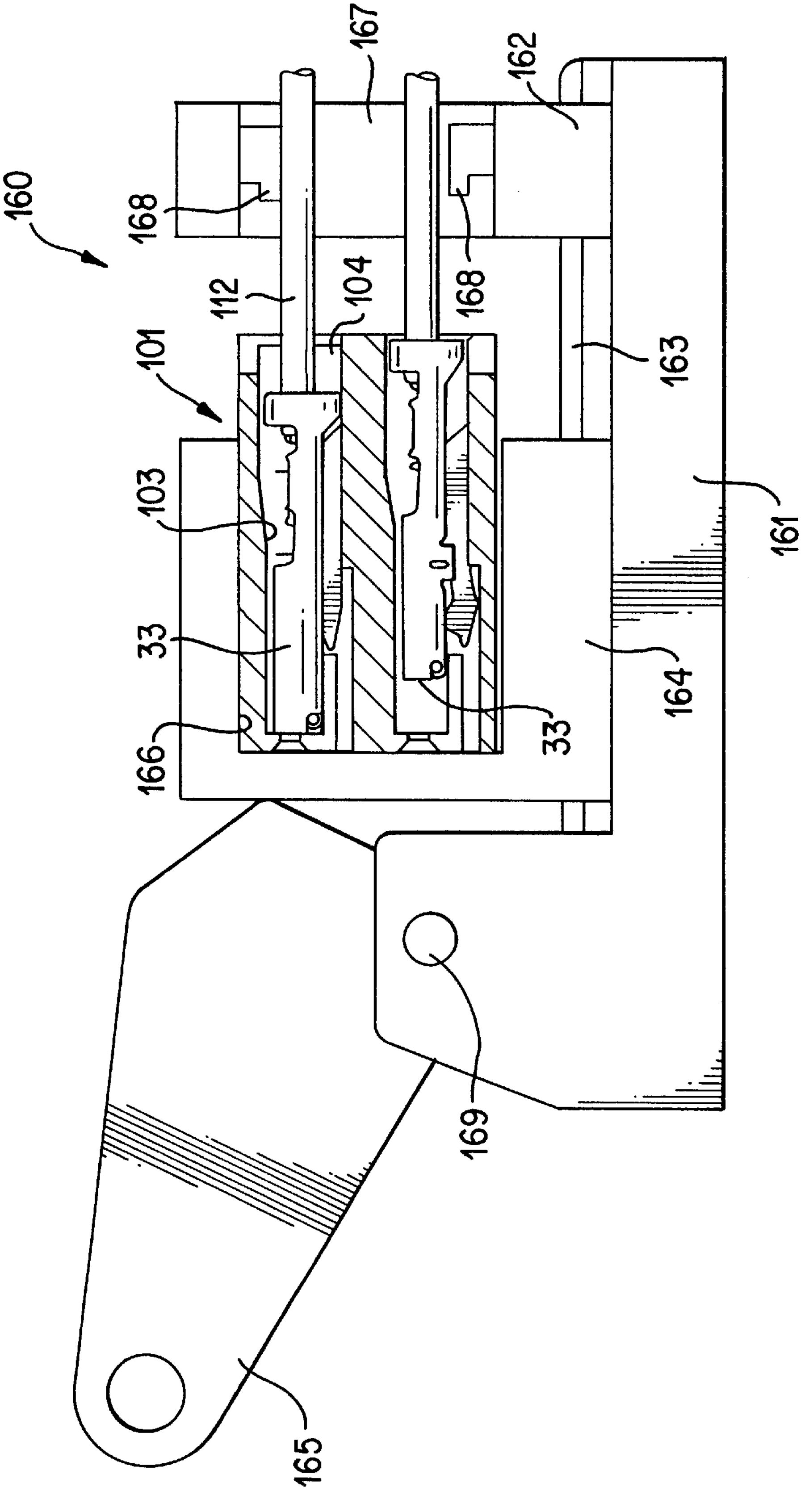
FIG. 13 is a cross-sectional view of a connector and still another embodiment of the terminal correcting apparatus.

The connector holder 164 holds the connector 101 (having a plurality of cavities 103 arranged in two stages) and has a connector holder portion 166 that is open toward the metal terminal-correcting jig 162 (that is, to the right in FIG. 13) and also toward a front side of the sheet of FIG. 13. The connector 101 is moved parallel to be received in the connector holder portion 166 from the front opening in such a manner that the direction of insertion of metal terminals 33 is kept parallel to the rail 163, with wires 112 extending toward the metal terminal-correcting jig 162. The connector 101, received in the connector holder portion 166, is held against movement by means (not shown). Insertion holes 104 of the cavities 103 in the connector 101 received in the connector holder portion 166 are open in facing relation to the metal terminal-correcting jig 162.

The metal terminal-correcting jig 162 has an open relief portion 167 that is open on its opposite sides (right and left sides in FIG. 13) in the direction of the length of the wires 112 of the connector 101 held in the connector holder portion 166, and is also open toward the front side of the sheet of FIG. 113. A plurality of pressing portions 168 are formed on and project from opposed inner surfaces of the relief portion 167, and are arranged in a manner corresponding to the cavities 103 arranged in two stages. The pressing portions 168 are opposed respectively to the insertion holes 104 of the cavities 103 in the connector 101 held in the connector holder portion 166.

The cam handle 165, which serves as a moving mechanism, is pivotally supported on a shaft 169 at that side remote from the metal terminal-correcting jig 162, with the connector holder 164 disposed between the cam handle and the jig 162. When the cam handle 165 is pivotally moved in a clockwise direction in FIG. 13, the connector holder 164 is urged by this cam handle 165 to move to the right in FIG. 13, that is, toward the metal terminal-correcting jig 162.

When the connector examination and correction device 160 of this embodiment is to be used, the connector 101 is first received in the connector holder portion 166 through the front opening (FIG. 13) in the connector holder 164, and the wires 112, extending form the connector 101, are received in the relief portion 167 through the front opening (FIG. 13) in the metal terminal-correcting jig 162.

In this condition, the cam handle 165 is pivotally moved to urge the connector holder 164 toward the metal terminal-correcting jig 162, and the pressing portions 168 are fitted respectively in the cavities 103 through the respective insertion holes 104.

During the movement of the connector holder 164, if the metal terminal 33 is disposed in an improperly-inserted position as shown in the lower stage of the connector in FIG. 13, the rear end of the metal terminal 33 abuts against the distal end of the associated pressing portion 168, so that this metal terminal 33 is moved in an opposite direction relative to the connector 101 to finally reach a properly-inserted position. Simultaneously with this, the other pressing portions 168 respectively abut against the rear ends of the metal terminals 33 disposed in their respective properly-inserted position.

If all of the metal terminals 33 are disposed in the properly-inserted position from the beginning, all of the pressing portions 168 abut against the rear ends of the metal terminals 33, respectively.

After the connector holder 164 is thus moved, the cam handle 165 is returned to return the connector holder 164 to its initial position, thereby disengaging the connector 101 from the pressing portions 68. Then, the connector 101 is removed from the connector holder portion 166, and the wires 112 are removed from the relief portion 167 of the metal terminal-correcting jig 162. Thereafter, the above operation can be effected for another connector 101.

The present invention is not limited to the above embodiments. For example, in the terminal correction embodiments, although the cavities in the connector are arranged in the two stages, the present invention can be applied even if the cavities are arranged in a single row or in three or more stages.

Where the cavities are arranged in three or more stages, one metal terminal-correcting jig is provided for each stage. Alternatively, the metal terminal-correcting jig can include an integral construction having a comb-like shape to cover each stage, in which case the pressing portions are formed on cantilever portions of the jig.

In FIG. 13, the metal terminal-correcting jig 162 having the pressing portions 168 is fixedly mounted, and the connector holder 164 having the connector holder portion 166 is movable toward and away from the metal terminal-correcting jig 162. However, in the present invention, the connector holder can be fixedly mounted, and the correcting block can be movable toward and away from the connector holder.

In the above terminal correction embodiments, each pressing portion of the metal terminal-correcting jig abuts against the rear end of the associated metal terminal to urge it from the improperly-inserted position to the properly-inserted position. However, in the present invention, means for pushing the metal terminals by pressing portions may be provided by a construction in which an open groove (not shown) in communication with the cavities is formed in the outer surface of the connector housing, and the pressing portions are inserted into the respective cavities through the open groove, and are engaged respectively with engagement portions formed at the respective metal terminals to urge the metal terminals. In the terminal examination apparatus, the relief recess 15*c* at the distal end portion of the lance check pin 15 can be formed if necessary. Various modifications can be made without departing from the spirit and scope of the invention as defined in the appended claims.

What is claimed is:

1. A device for examining a connector having metal terminals inserted into cavities formed in a connector housing, and lances formed in the connector housing that are elastically deformed into lance flexing spaces upon insertion of the metal terminals, said lances being restored to engage said metal terminals when said metal terminals are brought into a properly-attached condition, to retain said metal terminals against withdrawal, said device comprising:

at least one movable lance check pin with respect to the device, insertable into at least one of said lance flexing spaces, said at least one lance check pin, upon insertion, abutting against one of said lances when the metal terminals are in an improperly-attached condition, said at least one lance check pin having at least one guide portion for contacting inner surfaces of one of said lance flexing spaces so as to keep said at least one lance check pin in a proper orientation in one of said lance flexing spaces; and judgment means for judging from a position of the at least one lance check pin whether the at least one lance check pin is abutted against the lances.

2. A connector examination device according to claim 1, wherein said at least one lance check pin has a relief recess for preventing said at least one guide portion from interfering with stabilizers extending from the metal terminal on opposite sides of one of said lances.

3. A device for examining a connector having metal terminals inserted into cavities formed in a connector housing, and lances formed in the connector housing for each of the metal terminals that are elastically deformed into lance flexing spaces upon insertion of the metal terminals, the lances being restored to engage said metal terminals when said metal terminals are brought into a properly-attached condition, to retain said metal terminals against withdrawal, said device comprising:

an inspection housing having a setting portion for receiving the connector to be examined;

sliders mounted on said inspection housing for movement toward and away from the connector;

a lance check pin provided on each of said sliders, said lance check pins being insertable into said lance flexing spaces to be abutted against ends of the lances when the metal terminals assume improperly-attached conditions, each of said lance check pins having at least one guide portion for entering an inner area of one of said lance flexing spaces so as to keep said lance check pins in a proper orientation in said one lance flexing spaces; and judgment means mounted on each of said sliders for judging from positions of the lance check pins whether said lance check pins are abutted against the ends of the lances.

4. A connector examination device according to claim 3, wherein said judgment means comprises electrical contact members mounted for movement with the lance check pins so as to engage the metal terminal received and retained in the properly-attached conditions in the connector housing against withdrawal, said electrical contact members being connected to a conduction examination circuit for a wire harness.

5. A device for examining a connector wherein metal terminals are inserted into cavities formed in a connector housing of the connector, and lances formed in the connector housing are elastically deformed into lance flexing spaces upon insertion of the metal terminals, said lances being restored to engage said metal terminals when the metal terminals are brought into a properly-attached condition, to retain said metal terminals against withdrawal, said device comprising:

a connector holder for holding the connector to be examined;

an inspection housing provided in opposed relation to said connector holder;

a drive mechanism for moving at least one of said connector holder and said inspection housing toward the other;

sliders mounted on said inspection housing for movement toward and away from the connector;

a lance check pin provided on each of said sliders, said lance check pins being insertable into said lance flexing spaces and, upon insertion, abutting against ends of the lances when the metal terminals are in improperly-attached conditions, each of said lance check pins having at least one guide portion adapted to enter an inner area of one of said lance flexing spaces to keep said lance check pin in a proper orientation in said one lance flexing space; and judgment means mounted on each of said sliders for judging from the positions of the lance check pins whether said lance check pins are abutted against the lances.

6. A device for inspecting a terminal inserted within a connector housing, said connector housing having a lance capable of securing the terminal in a locking position and a lance flexing space into which the lance flexibly extends as the terminal is inserted within the connector housing, said device comprising:

a lance check pin that is movable between a first and second position and can be inserted in the lance flexing space when in the second position; and at least one guide portion for contacting an inner surface of said lance flexing space so as to keep the lance check pin in a proper orientation in said lance flexing space.

7. The device of claim 6, wherein said lance check pin is operatively connected to an electrical contact member that contacts said terminal when the terminal is in the locking position, and does not contact the terminal when the terminal is in an unlocked position wherein a tip portion of the lance check pin engages an end portion of the lance disposed in the lance flexing space.

8. The device of claim 7, wherein the lance check pin and the electrical contact member are connected to a slider to form an inspection unit provided within an examination device.

9. The device of claim 8, wherein the inspection unit slides within said inspection device against the bias of a spring when the tip portion of the lance check pin engages said end portion of said lance and the terminal is in the unlocked position, whereby the electrical contact portion does not contact the terminal.

10. The device of claim 9, wherein the electrical contact member is connected to a circuit for signaling the locking position and the unlocked position.

11. The device of claim 6, further comprising a first support provided for the connector housing and a second support provided for the lance check pin, wherein the first and second supports are moved into engagement with each other to inspect the position of the terminal.

12. The device of claim 6, wherein said guide portion includes a means for guiding a tip portion of the lance check pin to a first position below the lance when the lance is disposed in the locking position, even when the lance partially protrudes within the lance flexing space and the tip portion is at least one of irregularly formed and obliquely inserted.

13. The device of claim 12, wherein the means for guiding includes at least one guide portion provided near the tip portion of the lance check pin.

14. The device of claim 12, wherein the guiding means comprises two guide portions that straddle the lance and define a recess that provides a space in which stabilizers formed on the terminals are disposed.

15. A method of using the device of claim 1 for inspecting a terminal inserted within a connector housing, the connector housing having a lance capable of securing the terminal in a locking position and a lance flexing space into which the lance flexibly extends as the terminal is inserted within the connector housing, the method comprising:

inserting the at least one lance check pin into the lance flexing space; and guiding a tip portion of the at least one lance check pin to a first position below the lance when the lance is disposed in the locking position, even when the lance partially protrudes within the lance flexing space and the tip portion is at least one of irregularly formed and obliquely inserted.

16. The method of claim 15, wherein the tip portion includes at least one guide portion that ensures said tip portion is guidable to said first position when the lance is in the locking position.

17. The method of claim 16, wherein the at least one guide portion includes two spaced guide portions, the method including straddling the lance with the spaced guide portions when the lance check pin is in the first position.

18. The method of claim 17, wherein the tip portion further includes a relief recess disposed between the two spaced guide portions and further toward a distal end of the tip portion than the two guide portions, the relief portion providing a space between the terminal and the tip portion in which stabilizers formed on the terminals are disposed.

19. The method of claim 15, further comprising indicating one of said locking position and an unlocked position, said unlocked position being indicated when said tip portion of said lance check pin engages an end portion of said lance disposed within the lance flexing space.

20. The method of claim 19, wherein said indicating includes operatively connecting said lance check pin to an electrical contact member that contacts said terminal when the terminal is in the locking position, and does not contact the terminal when the terminal is in the unlocked position.

21. The method of claim 20, wherein the indicating includes connecting the lance check pin and the electrical contact member to a slider, thus forming an inspection unit provided within an examination device.

22. The method of claim 21, wherein the indicating includes sliding the inspection unit within said examination device against the bias of a spring during the inserting when the tip portion of the lance check pin engages said end portion of said lance and the terminal is in the unlocked position, whereby the electrical contact portion does not contact the terminal.

23. The method of claim 20, wherein the indicating includes connecting the electrical contact member to a circuit for signaling the locking position and the unlocked position.

24. The method of claim 15, further comprising providing the connector housing on a first support, providing the lance check pin on a second support, and moving the first and second supports toward each other to inspect the position of the terminal.

25. The method of claim 24, further comprising providing one of the first and second supports with a crank, and using the crank to reciprocate the connector housing back and forth with respect to the lance check pin.

26. A connector examination device according to claim 1, wherein said guide portion includes a means for guiding tip portions on said lance check pins to a first position below the lances when the lances are disposed in a locking position, even when the lances partially protrude within the lance flexing spaces, and the tip portions are at least one of irregularly formed and obliquely inserted.

27. The device of claim 26, wherein the means for guiding includes at least one guiding portion provided near the tip portions of said lance check pins.

28. The device of claim 26, wherein the means for guiding comprises two guiding portions that straddle each of said lances and define a recess that provides a space in which stabilizers formed on the terminals are disposed.

29. The device of claim 11, wherein one of the first and second supports is provided with a crank that reciprocates the connector housing back and forth with respect to the lance check pin.

* * * * *